United States Patent
Swerts

(10) Patent No.: US 10,573,688 B2
(45) Date of Patent: Feb. 25, 2020

(54) MAGNETIC JUNCTION DEVICE HAVING AN INTER-LAYER STACK BETWEEN A HARD MAGNETIC LAYER AND A REFERENCE LAYER, AND ASSOCIATED MAGNETIC RANDOM ACCESS MEMORY

(71) Applicant: IMEC vzw, Leuven (BE)

(72) Inventor: Johan Swerts, Kessel-Lo (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/137,336

(22) Filed: Sep. 20, 2018

(65) Prior Publication Data

US 2019/0088713 A1    Mar. 21, 2019

(30) Foreign Application Priority Data

Sep. 20, 2017    (EP) .................................... 17192068

(51) Int. Cl.
H01L 43/10    (2006.01)
H01L 43/08    (2006.01)
(Continued)

(52) U.S. Cl.
CPC ....... H01L 27/228 (2013.01); H01F 10/3268 (2013.01); H01F 10/3295 (2013.01);
(Continued)

(58) Field of Classification Search
CPC ........... H01L 27/222–228; H01L 43/02; H01L 43/08; H01L 43/10; H01L 43/12;
(Continued)

(56) References Cited

U.S. PATENT DOCUMENTS

2004/0257717 A1    12/2004  Sharma et al.
2004/0257718 A1    12/2004  Nickel et al.
(Continued)

FOREIGN PATENT DOCUMENTS

EP    1 903 624 A2    3/2008
EP    1 903 624 A3    8/2011

OTHER PUBLICATIONS

Parkin et al., "Spin engineering: Direct determination of the Ruderman-Kittel-Kasuya-Yosida far-field range function in ruthenium", The American Physical Society, vol. 44, No. 13, Oct. 1991.*
(Continued)

*Primary Examiner* — Younes Boulghassoul
(74) *Attorney, Agent, or Firm* — Knobbe, Martens, Olson & Bear LLP

(57) ABSTRACT

The disclosed technology generally relates to magnetic devices, and more particular to a magnetic structure, and a magnetic tunnel junction device and a magnetic random access memory including the magnetic structure. According to an aspect, a magnetic structure for a magnetic tunnel junction (MTJ) device includes a free layer, a tunnel barrier layer, a reference layer, a hard magnetic layer, and an inter-layer stack arranged between the hard magnetic layer and the reference layer. The inter-layer stack includes a first ferromagnetic sub-layer, a second ferromagnetic sub-layer and a non-magnetic spacer sub-layer. The non-magnetic spacer sub-layer is arranged in contact with and between the first ferromagnetic sub-layer and the second ferromagnetic sub-layer and is adapted to provide a ferromagnetic coupling of a magnetization of the first ferromagnetic sub-layer and a magnetization of the second ferromagnetic sub-layer. A magnetization direction of the reference layer is fixed by the hard magnetic layer and the inter-layer stack.

19 Claims, 1 Drawing Sheet

(51) Int. Cl.
*H01F 10/32* (2006.01)
*G11C 11/16* (2006.01)
*H01L 43/02* (2006.01)
*H01L 27/22* (2006.01)

(52) U.S. Cl.
CPC .............. *H01L 43/08* (2013.01); *H01L 43/10* (2013.01); *G11C 11/161* (2013.01); *H01L 43/02* (2013.01)

(58) Field of Classification Search
CPC .. G11C 11/14–1697; G11C 2211/5615; G11C 11/161; H01F 10/324–3295; H01F 10/3268–3295
See application file for complete search history.

(56) References Cited

U.S. PATENT DOCUMENTS

| | | | |
|---|---|---|---|
| 2006/0227466 A1 | 10/2006 | Yagami | |
| 2011/0303997 A1* | 12/2011 | Wang | B82Y 25/00 257/421 |
| 2014/0070341 A1* | 3/2014 | Beach | H01L 29/82 257/421 |
| 2014/0145792 A1 | 5/2014 | Wang et al. | |
| 2014/0327095 A1* | 11/2014 | Kim | H01L 43/08 257/421 |
| 2015/0001656 A1 | 1/2015 | Beach et al. | |
| 2015/0008550 A1 | 1/2015 | Min et al. | |
| 2015/0162525 A1* | 6/2015 | Park | H01L 43/10 257/421 |
| 2016/0093798 A1* | 3/2016 | Kim | H01L 43/08 257/421 |
| 2018/0026178 A1* | 1/2018 | Tran | H01L 43/08 257/421 |
| 2018/0123025 A1* | 5/2018 | Lee | H01L 27/222 |
| 2018/0248113 A1* | 8/2018 | Pinarbasi | H01L 43/08 |
| 2018/0248115 A1* | 8/2018 | Oguz | H01F 10/30 |
| 2019/0006583 A1* | 1/2019 | Tahmasebi | H01L 43/10 |

OTHER PUBLICATIONS

Ikeda et al., "Perpendicular-anisotropy CoFeB—MgO Based Magnetic Tunnel Junctions Scaling Down to 1x nm," Japan, 2014 in 4 pages.
Sato et al., "MgO/CoFeB/Ta/CoFeB/MgO Recording Structure in Magnetic Tunnel Junvtions With Perpendicular Easy Axis", IEEE Transactions on Magnetics, vol. 49, No. 7, Jul. 2013 in 4 pages.
Swerts et al., "Solving the BEOL Compatibility Challenge of Top-pinned Magnetic Tunnel Junction Stacks," Center for Nanoscience and Nanotechnology, CNRS, Univ. Paris—Sud, Univ. Paris—Saclay, France, 2017 in 4 pages.
European Search Report dated Apr. 5, 2018 in European Application No. 17192068; 8 pages.

* cited by examiner

MAGNETIC JUNCTION DEVICE HAVING AN INTER-LAYER STACK BETWEEN A HARD MAGNETIC LAYER AND A REFERENCE LAYER, AND ASSOCIATED MAGNETIC RANDOM ACCESS MEMORY

CROSS-REFERENCE TO RELATED APPLICATIONS

This application claims foreign priority to European Application 17192068.9, filed Sep. 20, 2017, the content of which is incorporated by reference herein in its entirety.

BACKGROUND

Field

The disclosed technology generally relates to semiconductor devices, and more particular to a magnetic structure, and a magnetic tunnel junction device and a magnetic random access memory including the magnetic structure.

Description of the Related Technology

Magnetic tunnel junctions (MTJs) have been widely researched for use in magnetic random access memories (MRAMs). Different types of MRAM technology have been developed, including spin transfer torque MRAM (STT-MRAM) and spin orbit torque MRAM (SOT-MRAM). One of the challenges in realizing MRAM in high volume production is developing MTJs which are thermally robust, such that the desired magnetic and electric properties of the MTJs are not lost during elevated temperature processing steps. To enable large-scale fabrication, an MTJ should in particular be compatible with the elevated temperatures which the MTJ may be subject to during back-end-of-line (BEOL) processing of semiconductor devices (e.g., about 400° C. or above).

SUMMARY OF CERTAIN INVENTIVE ASPECTS

An objective of the disclosed technology is to address the above-disclosed challenges faced by the MRAM technologies, among other challenges. Further and/or alternative objectives may be understood from the following.

According to a first aspect of the disclosed technology there is provided a magnetic structure of a magnetic tunnel junction (MTJ) device. The magnetic structure comprises: a free layer, a tunnel barrier layer, a reference layer, a hard magnetic layer, and an inter-layer stack arranged between the hard magnetic layer and the reference layer. The inter-layer stack includes a first ferromagnetic sub-layer, a second ferromagnetic sub-layer and a non-magnetic spacer sub-layer. The non-magnetic spacer sub-layer is arranged in contact with and between the first ferromagnetic sub-layer and the second ferromagnetic sub-layer and is adapted to provide a ferromagnetic coupling of a magnetization of the first ferromagnetic sub-layer and a magnetization of the second ferromagnetic sub-layer, wherein a magnetization direction of the reference layer is fixed by the hard magnetic layer and the inter-layer stack.

According to a second aspect, there is provided an MTJ device comprising: a bottom electrode and a top electrode, and the magnetic structure in accordance with the first aspect, wherein the magnetic structure is arranged between the bottom electrode and the top electrode.

According to a third aspect, there is provided a magnetic random access memory (MRAM) including a set of MTJ devices in accordance with the second aspect.

The disclosed technology is based on an insight that introduction of the inter-layer stack enables a thermally robust magnetic structure for an MTJ device. The disclosed technology enables a structure for an MTJ which is compatible with the thermal budget of conventional BEOL-processing. Hence, the magnetic structure may exhibit desirable electrical and magnetic performance also after the magnetic structure being subjected to processing at elevated temperatures of about 400° C. Notable electrical and magnetic properties include a sufficient degree of magnetic anisotropy of the reference layer and the pinning layer and a sufficiently high tunnel magneto-resistance ratio (TMR) for practical device implementations. A sufficient TMR is typically about 150% or greater.

Although BEOL-processing is one major process involving elevated temperatures, it should be noted that elevated temperatures may occur also during other processing steps, such as during annealing steps.

Elevated temperatures may promote diffusion processes between the layers of the magnetic structure. This may result in atomic species from the reference layer to be introduced into a hard magnetic layer of a pinning layer system, and atomic species from the hard magnetic layer to be introduced in the reference layer and the tunnel barrier layer. Without being bound to any theory, the diffusion processes may cause loss of magnetic anisotropy of the reference layer and the hard magnetic layer, a weaker coupling between the reference layer and the hard magnetic layer as well as a loss of TMR.

It has been realized that introduction of the inter-layer stack including the non-magnetic spacer sub-layer can effectively suppress diffusion between the reference layer and the pinning layer. The non-magnetic spacer sub-layer may accordingly act as a diffusion barrier, i.e. a layer counteracting or preventing diffusion.

The non-magnetic spacer sub-layer is formed between the first and the second ferromagnetic sub-layer and is adapted to provide a ferromagnetic (parallel) coupling of the magnetizations of the first and second ferromagnetic sub-layers. Thereby, a ferromagnetic coupling between the hard magnetic layer and the reference layer is enabled through the inter-layer stack.

Consequently, despite the presence of the inter-layer stack increases a separation distance between the reference layer and the hard magnetic layer, a ferromagnetic coupling between the hard magnetic layer and the reference layer that is comparable in strength to that in an analogous configuration in which the inter-layer stack is omitted, can be achieved (i.e. implying a reliable pinning-reference system).

The first and second ferromagnetic sub-layers of the inter-layer stack further provides a design flexibility, facilitating providing the inter-layer stack with a texture compatible with the other layers of the magnetic structure, in particular the pinning layer or the reference layer, depending on whether the magnetic structure has a top-pinned or a bottom-pinned configuration.

The magnetic structure comprises a stack of layers, including the free layer, the tunnel barrier layer, the reference layer, the hard magnetic layer and the inter-layer stack.

As used herein, the term "vertical" direction or "vertical" plane denotes a direction or a plane being parallel to a stacking direction of the layers of the magnetic structure. Correspondingly, the "vertical" direction/plane is perpendicular to a main plane of extension or a main surface of any of the layers of the magnetic structure. The terms "above" and "below" as used herein may accordingly refer to directions along the vertical direction and opposite to the vertical direction, respectively. As used herein, the term "horizontal" direction or "horizontal" plane denotes a direction or plane being perpendicular to the vertical direction/plane.

The magnetic structure may be supported by a substrate wherein a "vertical" direction/plane may be understood as a direction being perpendicular to a main plane of extension or main surface of the substrate. Correspondingly a "horizontal" direction/plane may be understood as a direction parallel to a main plane of extension or a main surface of the substrate. For instance, the magnetic tunnel junction device of the second aspect and/or the magnetic random access memory of the third aspect may include a substrate supporting the magnetic structure, wherein the magnetic tunnel junction device(s) may include, in a bottom-up direction away from the substrate, the bottom electrode, the magnetic structure, and the top electrode.

The free layer is a layer having a (net) magnetization which may be varied. That is, the direction of the magnetization vectors or magnetic moments of the free layer may be varied. The direction of the magnetization of the free layer may be varied between two states, a "parallel" state wherein the magnetization direction of the free layer is parallel to the magnetization direction of the reference layer and an "anti-parallel" state wherein the magnetization direction of the free layer is anti-parallel to the magnetization direction of the reference layer. The free layer may also be referred to as a storage layer or a programmable layer. The magnetization of the free layer may be oriented in-plane (in-plane magnetic anisotropy) or out of plane (perpendicular magnetic anisotropy, PMA). The free layer may be a ferromagnetic layer.

The tunnel barrier layer is a layer arranged between the reference layer and the free layer. The tunnel barrier layer may be adapted to allow a tunneling current across the tunnel barrier layer. The tunnel barrier layer may be a non-magnetic and electrically insulating layer.

The reference layer is a layer having a magnetization which is fixed or pinned. That is, the direction of the magnetization vectors or magnetic moments of the reference layer is fixed or pinned. The reference layer may also be referred to as the fixed layer or the pinned layer. In some embodiments disclosed herein, the magnetization of the reference layer may be oriented in-plane (in-plane magnetic anisotropy). In some other embodiments disclosed herein, the magnetization of the reference layer may be oriented out-of-plane, also referred to as perpendicular anisotropy (PMA). The reference layer may be a ferromagnetic layer.

As disclosed herein, an in-plane magnetic anisotropy refers to an orientation in which the direction of the magnetic anisotropy is in a direction parallel to a major surface or interface of the reference layer. On the other hand, an out-of-plane magnetic anisotropy or PMA refers to an orientation in which the direction of the magnetic anisotropy is in a direction normal to a major surface or interface of the reference layer.

A relative orientation of the magnetization directions of the reference layer and the free layer influences an electric resistance of the magnetic structure. The magnetic structure may exhibit a relatively low resistance when the magnetization of the reference layer and the free layer are aligned or parallel and a relatively high resistance when the magnetization directions of the reference layer and the free layer are anti-parallel with respect to each other. The TMR is a measure of the difference in the MTJ electrical resistance between the anti-parallel state and the parallel state.

The hard magnetic layer is a layer having a high (magnetic) coercivity. The hard magnetic layer enables the magnetization direction of the reference layer to be pinned. By the pinning effect exerted on the reference layer, the coercivity of the reference layer may be increased compared to the free layer.

The magnetization of the hard magnetic layer may be oriented in-plane (in-plane magnetic anisotropy) or out of plane (PMA).

The non-magnetic spacer sub-layer is a layer formed of a non-magnetic material. Non-magnetic materials include non-ferromagnetic materials or materials presenting no or substantially no net magnetization in absence of an external magnetic field. The non-magnetic spacer sub-layer may be formed of a paramagnetic material. Also a non-magnetic spacer sub-layer of a diamagnetic material is possible.

The non-magnetic spacer sub-layer may be a transition metal-including layer providing an Ruderman-Kittel-Kasuya-Yosida (RKKY)-coupling oscillating between antiferromagnetic and ferromagnetic as a function of layer thickness, wherein the thickness of the transition metal layer is such that the RKKY-coupling is ferromagnetic. A transition metal-including layer providing an oscillating RKKY-coupling (or shorter "RKKY-metal") makes it possible to provide a ferromagnetic coupling-function and a diffusion barrier-function by appropriately selecting the thickness thereof. The RKKY coupling is also known as the Ruderman-Kittel-Kasuya-Yosida interaction.

The non-magnetic spacer sub-layer may comprise Ru, Ir Rh or a combination thereof. These materials present a thickness dependent oscillatory RKKY-coupling and a texture compatible with materials typically used in magnetic structures for MTJs. Preferably, the non-magnetic spacer sub-layer is a Ru, Ir, or Rh layer. However, the non-magnetic spacer may also be a layer predominantly including Ru, Ir or Rh, or an alloy of Ru, Ir or Rh and a second species, such as another transition metal.

A Ru-based non-magnetic spacer sub-layer can present an oscillating RKKY-coupling and presents a ferromagnetic coupling beginning at a thickness range of about 10 to about 17 Å. In this range, advantageous diffusion barrier properties are also provided.

Preferably, the Ru-based non-magnetic spacer sub-layer has a thickness in the range of 11-16 Å, and more preferably 12-15 Å. In this range, the oscillation presents a (first experimentally observable) peak of ferromagnetic coupling strength.

An Ir-based non-magnetic spacer sub-layer presents an oscillating RKKY-coupling and presents a ferromagnetic coupling beginning at a thickness range of about 7 to about 13 Å. In this range, advantageous diffusion barrier properties are also provided.

Preferably, the Ir-based non-magnetic spacer sub-layer has a thickness in the range of 8-11 Å. In this range, the oscillation presents a (first experimentally observable) peak of ferromagnetic coupling strength.

Since Ru exhibits a first ferromagnetic coupling peak at a slightly greater thickness than Ir, Ru may provide form an even more efficient diffusion barrier than Ir. A greater thickness may also translate to improved texture-inducing properties towards the hard magnetic layer.

The first ferromagnetic sub-layer may be ferromagnetically coupled to the reference layer (directly or through an optional intermediate texture breaking layer described below). The second ferromagnetic sub-layer may be ferromagnetically coupled to the hard magnetic layer (and preferably be formed in contact with the hard magnetic layer). In case of a top-pinned configuration, the first ferromagnetic sub-layer may form a bottom layer of the inter-layer stack and the second ferromagnetic sub-layer may form a top layer of the inter-layer stack. In case of a bottom-pinned configuration, the first ferromagnetic sub-layer may form a top layer of the inter-layer stack and the second ferromagnetic sub-layer may form a bottom layer of the inter-layer stack.

Each one of the first ferromagnetic sub-layer and the second ferromagnetic sub-layer may comprise Co. Each one of the first ferromagnetic sub-layer and the second ferromagnetic sub-layer may be either a Co layer or a CoFe layer. In case of a CoFe layer, a Co/Fe ratio of the layer is preferably greater than 1.

The first ferromagnetic sub-layer may have a thickness in the range of 5-14 Å, preferably 11-13 Å, more preferably about 11.5 Å. The second ferromagnetic sub-layer may have a thickness in the range of 4-8 Å, preferably 5-7 Å, more preferably about 6 Å. Thicknesses in these ranges enable a comparably strong coupling between pinning layer and the reference layer, which is beneficial for the TMR.

The reference layer may comprise Fe, Co, CoB, CoFe or CoFeB, or a combination thereof. The reference layer may have a single-layer composition or include a stack of sub-layers of any one of Fe, Co, CoB, CoFe or CoFeB. These materials enable formation of high quality MTJs.

The hard magnetic layer may comprise Co. A Co-including layer enables a hard magnetic layer with PMA and a (111) texture. The hard magnetic layer may include a laminate of a Co sub-layer and one of a Pd, Pt or Ni sub-layer. The hard magnetic layer may include one or more alloys of Co and Pt, Ni, or Pd; or ternary alloys CoXCr, where X denotes Pt, Ni or Pd. Such Co-including layers enable forming of a layer with high coercivity and magnetic anisotropy. More generally, the magnetic compensation layer may be formed as a layer presenting PMA.

The hard magnetic layer may be arranged above the reference layer. This enables a top-pinned MTJ configuration. Top-pinned MTJs present an intrinsic advantage over bottom pinned MTJ configurations among others when implemented in combination with planar or finFET technology in "1-transistor-1-MTJ" designs. Top-pinned MTJs would be candidates for replacing bottom-pinned MTJs but limited thermal robustness of top-pinned MTJs compared to bottom-pinned MTJs remains an obstacle. By introducing the inter-layer stack according to the disclosed technology, thermal robustness and TMR may however be improved.

The inter-layer stack may act as a texture inducing seed layer for the hard magnetic layer. A high-performance top-pinned MTJs may include a reference layer and a hard magnetic layer presenting different textures (typically a (100) texture reference layer and a (111) texture hard magnetic layer). Without a proper seed, a sufficient degree of magnetic anisotropy may be challenging to achieve for the hard magnetic layer. The inter-layer stack with however enables providing of an appropriate texture for the hard magnetic layer (for instance a (111) texture for a (111) texture hard magnetic layer).

By the inter-layer stack also acting as a diffusion barrier, diffusion between the reference layer and the hard magnetic layer of for instance Fe and Pt, Pd or Ni (the actual diffusing species depending on the particular composition of the reference layer and the hard magnetic layer) may be counteracted. An improved texture of the pinning layer may further reduce the diffusion.

The magnetic structure may further comprise a texture-breaking layer arranged between the reference layer and the inter-layer stack. The texture-breaking layer may further facilitate forming of an increased magnetic anisotropy. The texture-breaking layer may be a Ta- or W-including layer.

The first ferromagnetic sub-layer may be arranged on and in contact with the texture breaking layer and the hard magnetic layer may be arranged on and in contact with the second ferromagnetic sub-layer. The combined benefits of the texture-breaking layer and the inter-layer stack may thereby be provided while limiting a separation between the reference layer and the hard magnetic layer.

The hard magnetic layer and the inter-layer stack may form, i.e. constitute, a ferromagnetic pinning layer adapted to fix the magnetization direction of the reference layer. The configuration of hard magnetic layer and the inter-layer stack may be by virtue of the parallel coupling through the non-magnetic spacer sub-layer be referred to as a synthetic ferromagnetic (SFM) pinning layer or pinning system.

In an MTJ device according to the second aspect including such a magnetic structure, the magnetic structure may further comprise a capping layer formed on the hard magnetic layer, wherein the top electrode may be formed on the capping layer. The capping layer can comprise chromium (Cr) or be a Cr layer. Introducing a capping layer comprising Cr can allow diffusion of the Cr into below layers of the magnetic structure, for instance when triggered by an anneal step. Without being bound to any theory, Cr can allow the thermal robustness of the magnetic structure and thus also of the MTJ device to be improved. The magnetic anisotropy and magnetic coercivity of the pinning system, and thus also the TMR, may also be improved.

The magnetic structure may further comprise a magnetic compensation layer arranged below the free layer and having a magnetization direction which is opposite to a magnetization direction of the hard magnetic layer. A compensation magnet layer enables a stray field of the hard magnetic layer and reference layer acting on the free layer to be compensated for by an opposite stray field from the compensation magnet.

As the inter-layer stack results in an increased separation between the free layer and the hard magnetic layer, a strength of the stray field acting on the free layer may be reduced. Consequently, the compensation magnet stray field need not be as strong as had the inter-layer stack not been present.

The magnetic compensation layer may be a Co-including layer. A Co-including layer enables a hard magnetic layer with PMA and a (111) texture. The magnetic compensation layer may include a laminate of a Co sub-layer and one of a Pd, Pt or Ni sub-layer. Laminates of [Co/Pd], [Co/Pt] or [Co/Ni] enable forming of a layer with high magnetic anisotropy, yielding a coercivity after patterning that is different from the hard magnetic layer coercivity. The hard magnetic layer may alternatively include one or more alloys of Co and Pt, Ni, or Pd; or ternary alloys CoXCr, X denoting Pt, Ni or Pd. More generally, the magnetic compensation layer may be formed as a layer presenting PMA.

The magnetic structure may further comprise a decoupling layer arranged between the magnetic compensation layer and the free layer. Magnetic decoupling between the magnetic compensation layer and the free layer may thereby be obtained. The decoupling layer may further form a texture-inducing seed layer for the free layer. The decoupling layer may further act as a diffusion barrier between the free layer and the magnetic compensation layer. The decoupling layer may be a Ru-including layer. A Ru-including layer (preferably a layer consisting of Ru) may provide reliable decoupling and barrier properties to the decoupling layer. The decoupling layer may be an MgO-including, or MgTiO-including, layer. The decoupling layer may thereby enhance the PMA of the free layer and strengthen the decoupling between the magnetic compensation layer and the free layer.

The hard magnetic layer may be referred to as a "first" hard magnetic layer wherein the magnetic structure may further comprise a "second" hard magnetic layer and a non-magnetic spacer layer arranged in contact with and between the first hard magnetic layer and the second hard magnetic layer and being adapted to provide an anti-ferromagnetic coupling of a magnetization of the first hard magnetic layer and the second hard magnetic layer. The magnetic structure may accordingly include a pinning layer formed by a SAF, which is ferromagnetically coupled to the reference layer through the inter-layer stack. This design is applicable to both top-pinned and bottom-pinned configurations.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Figure 1:
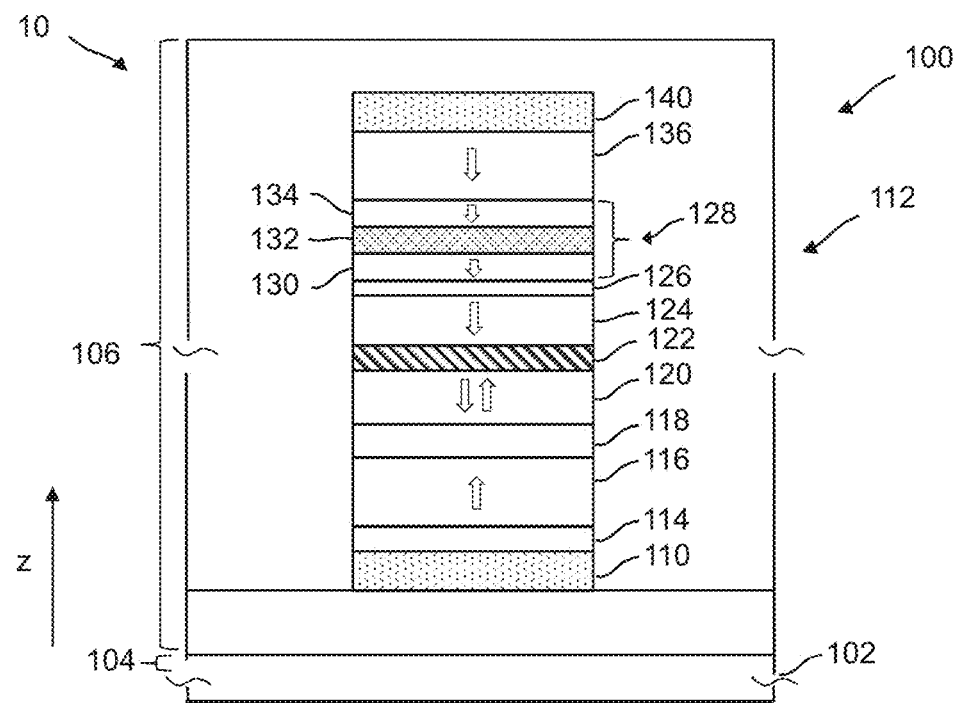
FIG. 1 schematically shows a cross-sectional view of a MTJ device including a magnetic structure, according to embodiments.

FIG. 1 illustrates in a cross-section a magnetic tunnel junction (MTJ) device 100, according to embodiments. The MTJ device 100 may be one among a plurality of similar MTJs forming part of a magnetic random access memory (MRAM) 10. It should be noted that for the purpose of clarity the various layers and other features of the stacks are not drawn to scale and their relative dimensions, in particular their thickness, may differ from a physical stack.

The MRAM 10 includes a substrate 102. The substrate 102 supports the MTJ device 100. The substrate 102 may be a suitable substrate or wafer, such as a semiconductor substrate. Examples of semiconductor substrates include a Si substrate, a Ge substrate, a SiGe substrate, a SiC substrate, a silicon-on-insulator (SOI) substrate, a germanium-on-insulator (GeOI) substrate, a silicon-germanium-on insulator (SiGeOI) substrate, to name a few.

Still referring to FIG. 1, the substrate 102 may support an active device portion 104. The active device portion 104 may include active devices formed in a semiconductor portion of the substrate 102. The devices may form logic circuit devices. The devices may include switches such as transistors used for reading and writing of the MTJs 100. Example active devices include metal-oxide-semiconductor field effect transistors (MOSFETs), metal-insulator-semiconductor field effect transistors (MISFETs), bipolar junction transistors (BJTs), JBTs, fin field effect transistors (FinFETs) and nanowire FETs, to name a few. The active devices may be formed using a suitable front-end-of-line (FEOL) processing. The active device portion 104 may hence also be referred to as a FEOL-portion 104.

The substrate 102 may support a back-end-of-line (BEOL) portion 106.

The BEOL-portion 106 may as shown be arranged above the FEOL portion 104. The BEOL portion 106 may interchangeably be referred to as an interconnect structure 106. The BEOL-portion 105 may include a number of (not shown) metal layers, e.g., metal lines, embedded in inter-layer dielectrics. The metal layers may be formed by horizontally extending conductive paths. Metal layers may, for instance, be formed of Cu, W, Au, Ag, Al, Co or Ru. Interlayer dielectrics may, for instance, include silicon oxide, silicon oxide nitride, silicon carbide nitride or silicon nitride. The BEOL portion 106 may include conductive (not shown) vertical vias interconnecting metal layers through the interlayer dielectrics. The conductive vias may, for instance, be formed of Cu, W, Au, Ag, Al, Co, Ni, Ru or highly doped semiconductor materials. One or more of the metal layers in the BEOL-portion 106 may define bit lines and word lines for the MTJs. The conductive paths of the BEOL-portion 106 may together with the active devices of the FEOL-portion 104 define logic circuitry for controlling reading and writing operations and for driving bit lines and word lines. The BEOL-portion 106 may be formed using conventional BEOL-processing.

The MTJ device 100 is arranged above the substrate 102. The MTJ device 100 may as shown be formed as part of, or embedded in, the BEOL-portion 106. In the illustrated embodiment MTJ device 100 has a pillar-shape, which may be cylindrical or polygonal. The MJT device 100 includes in a bottom-up direction, from the substrate 102 (i.e. the vertical direction "Z" as indicated in FIG. 1), a bottom electrode 110, a magnetic structure 112 and a top electrode 140. Typically, unless stated otherwise in the following, each of the layers of the MTJ device 100 may be formed with a thickness of a few A to a few tens of A.

The bottom electrode 110 may be formed of Ta, Ti, TaN, TiN, or an alloy or a layer stack of two or more of these materials. The bottom electrode layer 112 may be arranged on and in contact with a conductive line of the BEOL-portion 106. The bottom electrode 110 may also be arranged on and in contact with a via, which in turn is connected to a conductive line of the BEOL-portion 106. The top electrode 140 may be formed by Ru layer, a Ta layer or an alloy or a layer stack of including these material layers.

The magnetic structure 112 includes in a bottom-up direction a free layer 120, a tunnel barrier layer 122, a reference layer 124, an inter-layer stack 128 and a hard magnetic layer 136.

The free layer 120 may comprise or be formed of a ferromagnetic material.

Examples of ferromagnetic materials of the free layer 120 include Fe, Co, FeB, CoB, CoFe CoFeB, and a combination thereof. The free layer 120 may also have a multi-layer structure including combinations of the afore-mentioned materials, for instance a free layer formed of a CoFeB/X/CoFeB tri-layer stack, where X denotes for instance Ta, W or Mo.

The tunnel barrier layer 122 is arranged on and in contact with the free layer 120. The tunnel barrier layer 122 may include a layer of a dielectric material, for instance MgO, $AlO_x$, $MgAlO_x$, $MgTiO_x$, or a combination thereof. The tunnel barrier layer 122 has a suitable thickness such that electrons, e.g., spin-filtered electrons, can tunnel therethrough. Although FIG. 1 shows a single tunnel barrier configuration, embodiments are not so limited. In some embodiments, the magnetic structure 112 may include two or more tunnel barrier configuration, e.g., a dual-tunnel barrier layer configuration. A dual-tunnel barrier layer configuration may include a stack of a first free layer, a first tunnel barrier layer, a second free layer and a second tunnel barrier layer. This configuration may be extended beyond two tunnel barrier layer configurations.

The reference layer 124 is arranged on and in contact with the tunnel barrier layer 122. The reference layer 124 may be formed by a ferromagnetic material. Examples of the ferromagnetic material of the reference layer 110 include Fe, Co, FeB, CoB, CoFe, CoFeB and a combination thereof. The reference layer 110 may also have a multi-layer structure of two or more of these materials.

The magnetic structure 112 may, as shown, include a texture breaking layer 126 arranged on and in contact with the reference layer 124. A texture breaking layer 126 comprising or formed of Ta, Mo, W or a combination thereof may facilitate formation of a hard magnetic layer 136 (and an inter-layer stack 128) with a texture different from a texture of the reference layer 124. A texture breaking layer 126 comprising or formed of CoFeX or FeX, where X is Ta, Mo W or a combination thereof, is also possible.

The inter-layer stack 128 is arranged between the reference layer 124 and the hard magnetic layer 136. The inter-layer stack 128 includes in a bottom-up direction a first ferromagnetic sub-layer 130, a non-magnetic spacer sub-layer 132 and a second ferromagnetic sub-layer 134. For brevity the first ferromagnetic sub-layer 130 may in the following be referred to as the first FM layer 130. The second ferromagnetic sub-layer 134 may in the following be referred to as the second FM layer 134. The non-magnetic spacer sub-layer 132 may in the following be referred to as the spacer layer 132.

In the illustrated embodiment, the first FM layer 130 is arranged on and in contact with the texture breaking layer 126 when present, according to some embodiments. However, embodiments are not so limited, and in some embodiments, the texture breaking layer 126 may be omitted. In the configuration omitting the texture breaking layer 126, the first FM layer 130 may be arranged on and in contact with the reference layer 124. The first FM layer 130 is formed of a ferromagnetic material. For example, the first FM layer 130 may be a Co layer. The first FM layer 130 may be formed with a thickness in the range of 5-14 Å. If a Ta, W or Mo texture breaking layer 126 is present in the structure, the first FM layer 130 may preferably be formed with a thickness of 11-13 Å. As a specific example, the first FM layer 130 may be formed with a thickness of 11.5 Å+/−2%. If a CoFeX or FeX (X being Ta, Mo or W) texture breaking layer 126 is present in the structure, the first FM layer 130 may as specific example be formed with a thickness of 9 Å+/−5%.

The second FM layer 134 is arranged on and in contact with the spacer layer 132. The second FM layer 134 is formed of a ferromagnetic material.

The second FM layer 134 may be a Co layer. The second FM layer 134 may be formed with a thickness in the range of 4-8 Å, preferably 5-7 Å. As a specific example, the second FM layer 134 may be formed with a thickness of 6 Å+/−2%.

The inventors have observed that these thicknesses of the first and second FM layers 130, 134 can be critical to achieving a ferromagnetic coupling strength between the hard magnetic layer 136 and the reference layer 124 that may be comparable to the ferromagnetic coupling strength in an analogous structure without the inter-layer stack 128.

The spacer layer 132 is arranged in contact with and between the first FM layer 130 and the second FM layer 134. The spacer layer 132 is adapted to provide a ferromagnetic coupling of the magnetization of the first FM layer 130 and the magnetization of the second FM layer 134. The inventors have observed that the thickness of the non-magnetic spacer layer 132 can be critical in achieving a ferromagnetic coupling between the first FM layer 130 and the second FM layer 134 based on the RKKY coupling. The spacer layer 132 may be formed by a Ru layer having a thickness in the range of 11-16 Å, and more preferably 12-15 Å. Alternatively, spacer layer 132 may be formed by an Ir layer having a thickness in the range of 7-13 Å, 8-11 Å or 6.5-10 Å. However, alternative configurations of the spacer layer are also possible. For example, other transition metal materials may also be used such as 3d, 4d or 5d transition metals adapted for ferromagnetic Ruderman-Kittel-Kasuya-Yosida (RKKY)-coupling in respective thickness ranges, for instance Rh, Au, Ag or Cu, to mention a few candidate materials.

The hard magnetic layer 136 is arranged above the reference layer 124 and the inter-layer stack 128. More specifically, the hard magnetic layer 136 is arranged on and in contact with the second FM layer 134. The hard magnetic layer 136 is formed by a high-coercivity material. The hard magnetic layer 136 may include a laminate (i.e. a "superlattice") of [Co/Pd], [Co/Pt] or [Co/Ni] bilayers, repeated a number of times, such as 4-8. Other possible compositions of the hard magnetic layer 136 include a Co layer, an Fe layer or a CoFe layer or a laminate of a [Fe/X] or [CoFe/X], repeated a number of times, where X can be Pd, Pt, Ni, Tb or Gd. A hard magnetic layer having an alloy composition is also possible, such as an alloy of Co, Fe or CoFe and Pt, Pd, Ni, Tb or Gd. Further examples include ternary alloys of CoXCr, where X denotes Pt, Ni, Pd, Tb or Gd. These materials may form layers presenting a (111) texture and PMA following a patterning for forming the pillar-shape of the magnetic structure.

FIG. 1 includes arrows representing directions of magnetization of the magnetic layers of the magnetic structure 112. As indicated by the oppositely directed arrows within the free layer 120 the magnetization direction of the free layer 120 may be switched between two opposite directions, a parallel direction (P) and an anti-parallel direction (AP) with respect to the fixed magnetization direction of the reference layer 124. The magnetization direction of the hard magnetic layer 136 is fixed and parallel to the magnetization direction of the reference layer 124.

The hard magnetic layer 136 is ferromagnetically coupled to the second FM layer 134. The second FM layer 134 is ferromagnetically coupled to the first FM layer 130 through the spacer layer 132. The first FM layer 130 is ferromagnetically coupled to the reference layer 124 (through the texture breaking layer 126 if present). Accordingly, a magnetization direction of the reference layer 124 is fixed by the hard magnetic layer and the inter-layer stack. The hard magnetic layer 136 and the inter-layer stack 128 accordingly forms a "synthetic ferromagnetic" (SFM) pinning layer which fixes the magnetization direction of the reference layer 124 Since the SFM pinning layer is arranged above the reference layer 124, the reference layer 124 and the MTJ device 110 is top-pinned.

It should be noted that the illustrated downward orientation of the magnetization directions of the reference layer 124, the first and second FM layers 130, 134, and the hard layer 136 is merely an example and an opposite, upward orientation is also possible. Moreover, although FIG. 1 indicates layers with perpendicular magnetic anisotropy (PMA), it is as is known to the person skilled in the art also possible to form magnetic layers presenting an in-plane magnetic anisotropy.

As illustrated, the magnetic structure 112 may further comprise a magnetic compensation layer 116 arranged below the free layer 120. The magnetic compensation layer 116 is formed to present a magnetization direction which is opposite to the magnetization direction of the hard magnetic layer 136. The compensation magnet layer 116 hence enables stray field compensation. The magnetic compensation layer 116 may comprise Co. Example materials for the magnetic compensation layer include the same examples as discussed above in connection with the hard magnetic layer 136.

The magnetic structure may further comprise a seed layer 114 arranged on and in contact with the bottom electrode 110. The magnetic compensation layer 116 may be arranged on and in contact with the seed layer 114. The seed layer 114 may facilitate forming of the magnetic compensation layer 116 by inducing a proper texture. The seed layer 114 may be formed of Pt, Hf, Ru, Jr, Ta, Cr, Ni, or alloys or bilayers thereof. Other options are antiferromagnetic materials (AFM materials), such as IrMn, PtMn, MnN. An AFM material seed layer 114 may provide biasing of the magnetic compensation layer 116.

The magnetic structure 112 may further comprises a decoupling layer 118 arranged between the magnetic compensation layer 116 and the free layer 120. In some embodiments, the decoupling layer may be a metal layer, e.g., a Ru layer. In some other embodiments, the decoupling layer may be an insulating layer, e.g., a MgO layer or a MgTiO layer. A decoupling layer including or consisting of Ta, Pt, Pd, Tb, Gd, W, Mo, Hf, Ti or V, or alloys or bilayers thereof is also possible.

Although not shown, a Cr-including capping layer may be formed on and in contact with the hard magnetic layer 136. The top electrode 140 may be formed on and in contact with the capping layer. The capping layer may be formed of one or more monolayers of Cr, or a combination of a Cr layer and a layer of an element selected from the group consisting of: Ni, Ta, Pt, Pd, Tb, Gd, W, Mo, Ru, Bi, Hf, Fe, Co, Ti and V.

The layers of the MTJ device 100 may be deposited in a manner which per se is known in the art, for instance by sputtering or evaporation processes. The layer stack, once deposited, may subsequently be patterned into pillar-shaped features presenting rounded (such as oval or circular), rectangular or more generally polygonal cross sections. The fabrication process may further include one or more annealing steps for causing crystallization of the magnetic layers (and triggering Cr-diffusion from the capping layer if present). An anneal step may include subjecting the layers to a temperature of at least 250° C., however preferably not greater than 400° C. Subsequent to forming the MTJs, interlayer dielectrics embedding the MTJs and conductive paths for connecting to the MTJs may be formed using conventional BEOL processing.

Although in the above, an MTJ device of a top-pinned configuration has been described, it should be noted that a bottom-pinned configuration also is possible by forming the free layer above the hard magnetic layer, the inter-layer stack and the reference layer etc. The inter-layer stack would still provide a corresponding function albeit not provide the above described texture-inducing function towards the hard magnetic layer.

Figure 2:
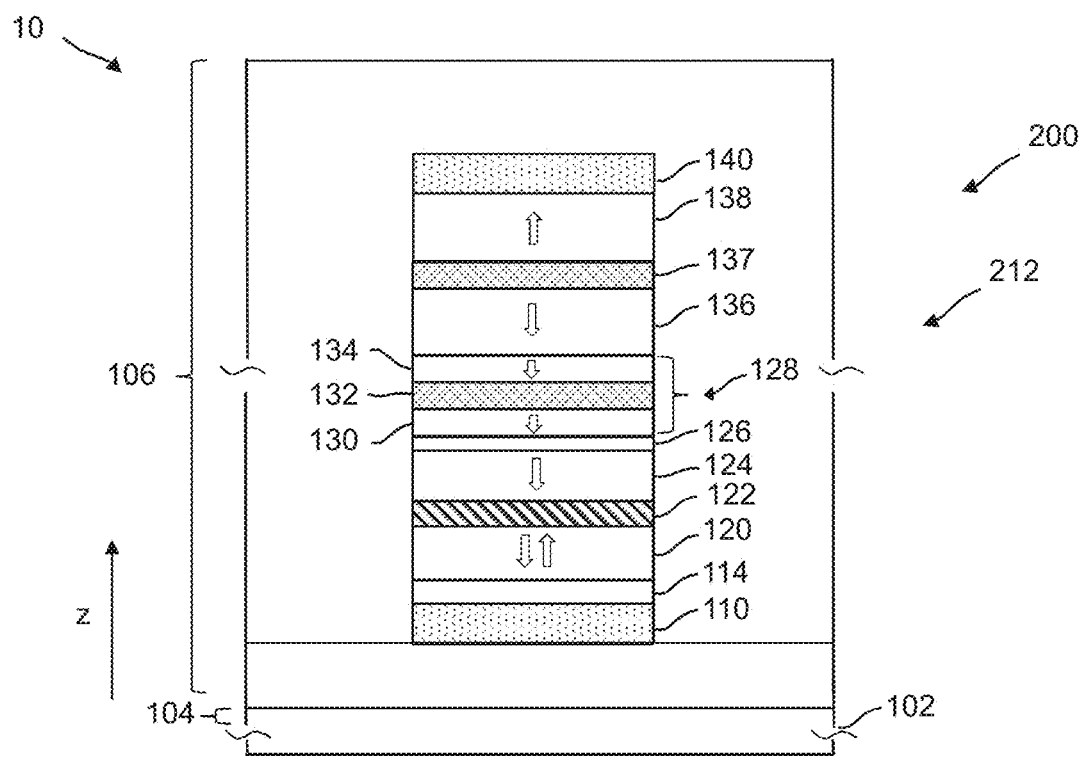
FIG. 2 schematically shows a cross-sectional view of a MTJ device including a magnetic structure, according to embodiments.

FIG. 2 illustrates an MTJ device 200 according to an alternative embodiment. Corresponding reference numbers in FIGS. 1 and 2 refer to corresponding features, wherefore reference is made to the above description. The MTJ device 200 differs from the device 100 by comprising a magnetic structure 212 including a non-magnetic spacer layer 137 providing an anti-parallel (i.e. antiferromagnetic) coupling of the magnetizations of the (first) hard magnetic layer 136 and a (second) hard magnetic layer 138. The spacer layer 137 may for instance be a layer of Ru (or other RKKY-transition metal) of a thickness corresponding to a peak of an antiferromagnetic coupling strength. The magnetic structure 212 may accordingly include a SAF-type pinning layer system, which is ferromagnetically coupled to the reference layer 124 through the inter-layer stack 128.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A magnetic structure of a magnetic tunnel junction device, the magnetic structure comprising:
   a free layer;
   a tunnel barrier layer;
   a reference layer;
   a hard magnetic layer; and
   an inter-layer stack arranged between the hard magnetic layer and the reference layer, wherein the inter-layer stack includes:
      a first ferromagnetic sub-layer,
      a second ferromagnetic sub-layer, and
      a non-magnetic spacer sub-layer,
      wherein the non-magnetic spacer sub-layer is arranged in contact with and between the first ferromagnetic sub-layer and the second ferromagnetic sub-layer and is adapted to provide a ferromagnetic coupling of a magnetization of the first ferromagnetic sub-layer and a magnetization of the second ferromagnetic sub-layer,
   wherein a magnetization direction of the reference layer is fixed by the hard magnetic layer and the inter-layer stack.

2. The magnetic structure according to claim 1, wherein the non-magnetic spacer sub-layer comprises a transition metal and is adapted to provide the ferromagnetic coupling between the first and second ferromagnetic sub-layers through a Ruderman-Kittel-Kasuya-Yosida (RKKY)-coupling that oscillates between an antiferromagnetic coupling and a ferromagnetic coupling depending on the thickness of the non-magnetic spacer sub-layer, wherein the thickness of the non-magnetic spacer sub-layer is such that the RKKY-coupling is an ferromagnetic coupling.

3. The magnetic structure according to claim 1, wherein the non-magnetic spacer sub-layer comprises ruthenium (Ru).

4. The magnetic structure according to claim 3, wherein the non-magnetic spacer sub-layer comprising Ru has a thickness of 11-16 Å.

5. The magnetic structure according to claim 1, wherein the non-magnetic spacer sub-layer comprises iridium (Jr).

6. The magnetic structure according to claim 5, wherein the non-magnetic spacer sub-layer comprising Ir has a thickness of 7-13 Å.

7. The magnetic structure according to claim 1, wherein each of the first ferromagnetic sub-layer and the second ferromagnetic sub-layer comprises cobalt (Co).

8. The magnetic structure according to claim 1, wherein each of the first ferromagnetic sub-layer and the second ferromagnetic sub-layer comprises CoFe.

9. The magnetic structure according to claim 1, wherein the first ferromagnetic sub-layer has a thickness of 5-14 Å, and wherein the second ferromagnetic sub-layer has a thickness of 4-8 Å.

10. The magnetic structure according to claim 1, wherein the reference layer comprises Fe, Co, FeB, CoB, CoFe or CoFeB.

11. The magnetic structure according to claim 1, wherein the hard magnetic layer comprises Co.

12. The magnetic structure according to claim 1, wherein the hard magnetic layer is formed above the reference layer.

13. The magnetic structure according to claim 12, further comprising a texture-breaking layer between the reference layer and the inter-layer stack.

14. The magnetic structure according to claim 13, wherein the hard magnetic layer and the inter-layer stack serve as a ferromagnetic pinning layer adapted to fix the magnetization direction of the reference layer.

15. The magnetic structure according to claim 14, wherein the magnetic structure comprises a magnetic compensation layer arranged below the free layer and having a magnetization direction which is opposite to a magnetization direction of the hard magnetic layer.

16. The magnetic structure according to claim 1, wherein the magnetic structure further comprises a second hard magnetic layer and a non-magnetic spacer layer arranged in contact with and between the hard magnetic layer and the second hard magnetic layer, the non-magnetic spacer layer being adapted to provide an anti-ferromagnetic coupling of a magnetization between the hard magnetic layer and the second hard magnetic layer.

17. The magnetic structure according to claim 1, wherein the reference layer, the hard magnetic layer, the first ferromagnetic sub-layer and the second ferromagnetic sub-layer have the same fixed magnetization direction.

18. A magnetic tunnel junction device comprising a bottom electrode, a top electrode, and the magnetic structure according to claim 1 formed between the bottom electrode and the top electrode.

19. A magnetic random access memory including a set of magnetic tunnel junction (MTJ) devices, wherein each of the MTJ devices is in accordance with claim 18.

* * * * *